United States Patent [19]
Rabaey et al.

[11] Patent Number: 4,717,848
[45] Date of Patent: Jan. 5, 1988

[54] ELECTRONIC CIRCUITS AND SIGNAL GENERATOR USING THEM

[75] Inventors: Cornelius Rabaey, Borgerhout; Didier R. Haspeslagh, Harelbeke, both of Belgium

[73] Assignee: ALCATEL N.V., Amsterdam, Netherlands

[21] Appl. No.: 650,337

[22] Filed: Sep. 13, 1984

[51] Int. Cl.[4] .............................................. H03K 5/08
[52] U.S. Cl. .................................... 307/549; 307/261; 307/263; 307/264; 307/555
[58] Field of Search ............... 307/261, 262, 264, 555, 307/568, 263, 549

[56] References Cited
U.S. PATENT DOCUMENTS
3,588,537  6/1971  Brink .................................. 307/264
3,846,645  11/1974  Kim et al. .......................... 307/264

Primary Examiner—John Zazworsky
Attorney, Agent, or Firm—Spencer & Frank

[57] ABSTRACT

A signal generator for generating a pulse wavetrain signal with each pulse having slopes at both the leading and trailing edges and the generated signal having a predetermined amplitude between pulses, the signal generator including: circuit components for generating first and second pulse signals which vary between first and second reference levels, with the second signal being inverted with respect to the first signal and each signal having corresponding sloping leading and trailing edges, circuit components for comparing the first and second pulse signals to derive a first control signal indicative of the presence of a pulse and a second control signal indicative of the period between pulses, and a switching device connected to receive a signal containing the first and second pulse signals and controlled by the first and second control signals to provide at an output a pulse during the first control signal and a predetermined reference level during the second control signal, whereby the predetermined reference level between pulses is always known.

13 Claims, 4 Drawing Figures

ELECTRONIC CIRCUITS AND SIGNAL GENERATOR USING THEM

The present invention relates to a signal generator for generating a signal with pulses having sloping edges.

Signal generators which provide pulses with sloping edges are known in the art. In any event, when operational amplifiers are used to obtain such a pulse waveform, the offsets of the operational amplifiers provide a signal which has an extremely high amplitude in the time intervals between the pulses. This interpulse amplitude can cause many problems in telephone systems and serves to increase the effective noise that a subscriber would hear in the subset.

An object of the present invention is to provide a signal generator of the above type, but which does not present this drawback, i.e. wherein the amplitude of the signal generated has a predetermined amplitude, e.g. 0 Volt, in the interpulse time intervals.

The object is achieved by utilizing a circuit which includes a generator. The generator is adapted to provide a signal in the time intervals between pulses which has an amplitude with respect to a reference signal such that the amplitude can be detected by a conventional detector circuit and can be limited after detection to a predetermined reference value.

In order to accomplish these results, the amplitude of the signal during the interpulse time interval is selected to be high. Based on the relatively high amplitude, this can be detected by the detector circuit and used by the limiter circuit to enable one to provide an output about a given reference value.

The signal generator according to this invention is associated with a detector circuit. The detector circuit is implemented by a comparator circuit which is associated with a limiting circuit. The limiting circuit is controlled by the comparator circuit such that when the signals are applied to the comparator circuit, the pulse periods and the interpulse time intervals of the pulse signal are detected. In this manner, the comparator circuit controls the limiting circuit so that the circuit limits the amplitude to the reference value in the interpulse time intervals.

Still another characteristic of the present signal generator is that it includes: a pulse source which generates opposite first and second pulse waveforms, as well as a modulator circuit with a pair of first modulator inputs to which said first and second signals are applied respectively, with a pair of second modulator inputs to which said first and second pulse waveforms are applied, and with a modulator output which is coupled with said modulator output, said first modulator inputs being coupled via a third and a fourth gating circuit to said modulator output respectively and said second modulator inputs constituting control inputs of said third and fourth gating circuits respectively, such that a pulse waveform modulated by said first and second signals is generated at said modulator output.

Yet another characteristic of the present signal generator is that said opposite first and second pulse waveforms are pulse density modulated pulse waveforms and that said generator output is coupled to a filter device including a lowpass filter to transform said modulated pulse waveform into a modulated sine waveform.

Still another characteristic of the signal generator according to the invention is that said filter device also includes a bandpass filter to allow the passage of said sine waveform and to limit the amount of power in the lower frequency region thereof.

Still other characteristics of the present signal generator are that the lower frequency region is the speech region, that the first and second signals are mutually inverse and that the modulated sine wave is used as a metering signal for telecommunication purposes.

Based on the operation of this circuit, the metering signal has a desired reference value—namely, zero volts which appears in the time intervals between pulses. The pulses are essentially sine waves. In this manner, during the interpulse intervals, the telephone system cannot interpret the relatively low level interpulse signal as being a metering signal. As one can ascertain, if this signal has a considerable amplitude in the interpulse intervals, the telephone system via the subset could confuse this as being an effective metering signal. Due to the controlled amplitude of the interpulse signals, the resultant signal does not produce clicks in the subset because the pulses which essentially are sine waves have sloping edges. This serves to reduce the amount of power in the audio region which excessive power, as in prior art devices, produced clicks in the subset. The filtering schemes employed further reduces the amount of power coupled to the subset to therefore avoid the above-noted problem.

The invention also relates to a comparator circuit with a first and a second input and with complementary first and second outputs, characterized in that said first and second inputs are coupled with first and second inputs of first and second inverters via first and second gating circuits, said inverters being coupled in a closed loop, a DC source being coupled via said inverters through a gating device and said complementary outputs being the inverter outputs.

The invention also relates to a modulator circuit with pairs of first and second inputs and with an output, characterized in that each of said first inputs is coupled with said output via first and second gates and that said second inputs constitute respective control inputs of said first and second gates.

The above mentioned and other objects and features of the invention will become more apparent and the invention itself will be best understood by referring to the following description of embodiments taken in conjunction with the accompanying drawings wherein.

Figure 1:
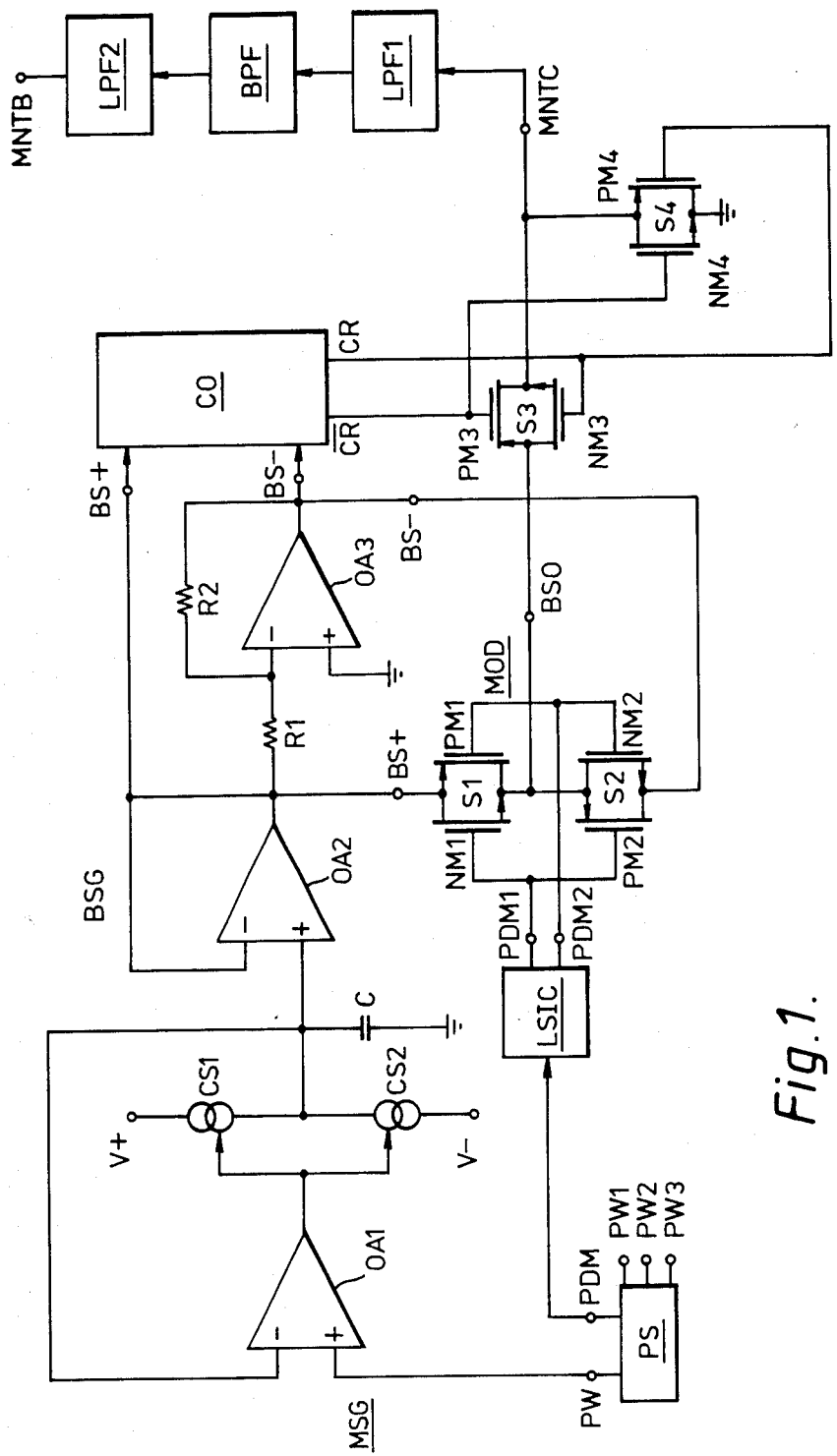
FIG. 1 represents a pulse generator MSG according to the invention.

The signal or pulse generator MSG shown is a metering signal generator. It forms part of a transcoder and filter circuit which is included in a telephone line circuit connected between a telephone line, coupled to a telephone subset, and a telephone switching network. The line circuit includes the cascade connection of a subscriber line interface circuit, able to perform line control and supervision, a digital signal processor adapted to execute analog-to-digital and digital-to-analog conversion operations, the above transcoder and filter circuit which is able to generate a metering signal and moreover to transform 13-bit linear PCM signals into 8-bit companded PCM signals and vice-versa, and a dual processor terminal controller to ensure the general control of the line circuit. The transcoder and control circuits are provided in common for eight associated subscriber line interface circuits and digital signal processors.

As will be explained hereinafter the metering signal generated by the pulse generator MSG comprises bursts of 12 kHz or 16 kHz sine waves which are symmetrical about a 0 Volts reference and have a minimum length of 100 milliseconds. In order that these bursts do not produce audible clicks in the telephone subset they have gradually varying leading and trailing edges and are moreover suitably filtered. These techniques operate to decrease the power in the audible frequency region of the signal which is responsible for such audible clicks.

The signal generator MSG shown includes a pulse source PS providing at its outputs PW, PDM and PW1 to PW3 a pulse waveform PW (FIG. 2), a Pulse Density Modulated (PDM) binary signal PDM (not shown) and pulse waveforms PW1 to PW3 (FIG. 4) respectively. Pulse waveform PW has a frequency of 3.13 Hz and an amplitude varying between reference voltages (VREF2$= -0.7$ Volts and $+$VREF1$= +2.5$ Volts. The binary signal PDM has an amplitude varying between V$- = -5$ Volts, and 0 Volt and a selectable frequency of 4096 kHz or of 2048 kHz and is such that when it is passed through a suitable lowpass filter a pure sine wave with a frequency of 12 kHz or 16 kHz is obtained respectively. The pulse waveforms PW1 to PW3 vary between $-5$ Volts and V$+ = +5$ Volts and have a frequency of 256 kHz.

The pulse waveform PW is applied to the non-inverting input of an operational amplifier OA1 forming part of a burst signal generator BSG with outputs BS$+$ and BS$-$ and further includes constant current sources CS1 and CS2, operational amplifiers OA2 and OA3, resistors R1 and R2 of equal value and capacitor C. As schematically indicated by the arrows, the output of OA1 controls the current sources CS1 and CS2, which are connected in series between V$+$ and V$-$. The junction point of CS1 and CS2 is connected to the inverting input of OA1, also to ground via capacitor C and finally to the non-inverting input of unity gain amplifier OA2 which isolates capacitor C from the output of OA2. This output is connected via resistor R1 to the inverting input of OA3 whose output is connected to its inverting input through feedback resistor R2 and whose non-inverting input is grounded. The outputs of OA2 and OA3 constitute the above mentioned outputs BS$+$ and BS$-$ respectively.

Figure 2:
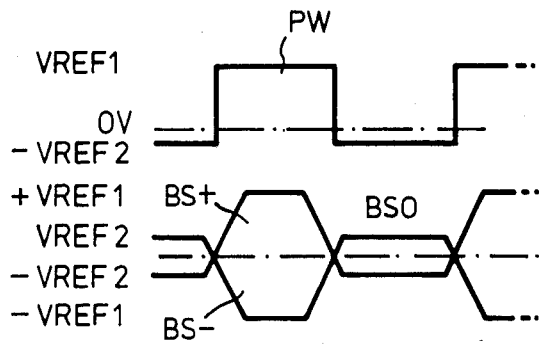
FIG. 2 shows waveforms PW and BSO appearing at terminals PW and BSO of FIG. 1 respectively.

When the pulse waveform PW is applied to OA1, capacitor C is charged in a linear way by the constant current provided by current source CS1 and until its voltage reaches $+$VREF1 or is discharged in a linear way by the constant current flowing to V$-$ through current source CS2 and until its voltage reaches (VREF2). During the charging and discharging of the capacitor and during the off intervals of the pulse waveform PW, the capacitor remains at $+$VREF1 or at $-$VREF2. The output of the capacitor provides an asymmetrical pulse waveform BS$+$ (FIG. 2) which extends about zero volts as shown in FIG. 2 with the leading and trailing edges having sloping, rising and decaying edges. The rise and decay times are equal to about 20 milliseconds. The constant amplitude portions between these sloping edges each have a minimum duration of about 100 milliseconds.

To obtain a pulse waveform which varies symmetrically about 0 Volt, the unsymmetrical pulse waveform BS$+$ at the output of capacitor C is first reproduced at the output BS$+$ of OA2 and then inverted in OA3. The latter generates at its output BS$-$ the like named pulse waveform BS$-$ varying between $+$VREF2 and $-$VREF1 and also alternately extending at different sides of 0 Volt as shown in FIG. 2.

These pulse waveforms BS$+$ and BS$-$ are now applied to the data inputs of a modulator circuit MOD comprising two switches S1 and S2 each with a PMOS transistor PM1/2 and an NMOS transistor NM1/2. The first and second control inputs of these switches S1/S2 are the gate electrodes of the transistors PM1/2 and NM1/2 respectively; their data inputs are the interconnected source of PM1/NM2 and drain of NM1/PM2; and their data outputs are the commoned drain of PM1/NM2 and source of NM1/PM2. Output BS$+$ and BS$-$ of BSG are connected to the data inputs of S1 and S2 whose data outputs are commoned and constitute the output BSO of the modulator circuit MOD. The inputs PDM1/2 are applied to the commoned first/second and second/first control inputs of the switches S1 and S2. The output PDM of the pulse source PS is connected to the input of a level shifter and inverter circuit LSIC having two outputs PDM1 and PDM2 connected to the inputs of the modulator circuit MOD respectively.

In circuit LSIC the level of the pulse waveform PDM varying between 0 Volts and V$-$ is shifted so that a pulse waveform PDM1 varying between V$+$ and V$-$ is obtained and PDM1 is then inverted to produce pulse waveform PDM2. These two opposite pulse waveforms PDM1 and PDM2 are such that they close either switch S1 or S2 of the modulator circuit MOD, thus applying either BS$+$ or BS$-$ to the output BSO thereof. As a consequence the PDM pulse waveform BSO at this output BSO is symmetrical about 0 Volts and limited between BS$+$ and BS$-$. In FIG. 2, the envelope of this PDM pulse waveform BSO is represented, this envelope varying between $+$VREF1 and $-$VREF1 in the pulse or burst periods and between VREF2 and $-$VREF2 in the time intervals between these pulses. These pulse periods and interpulse time intervals are determined by the crossings of BS$+$ and BS$-$ which occur on the 0 Volt axis.

Figure 3:
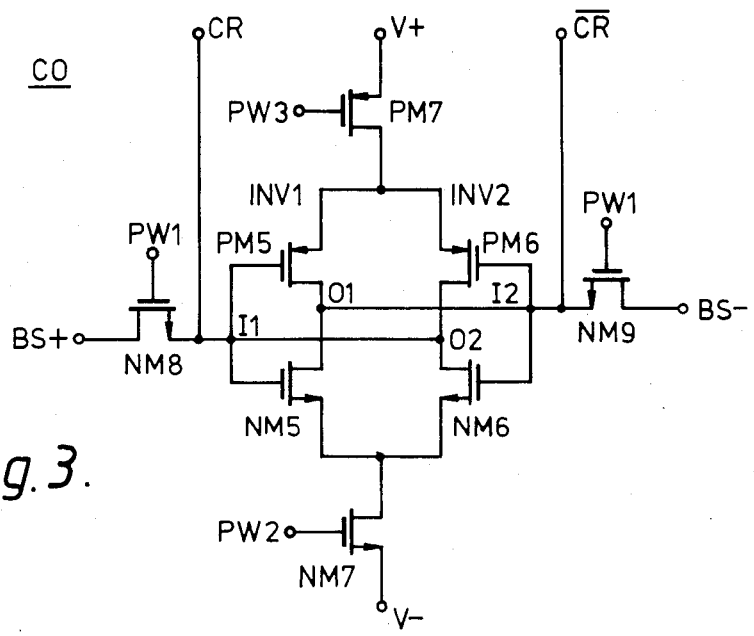
FIG. 3 is a detailed schematic diagram of the Comparator Circuit of FIG. 1.
Figure 4:
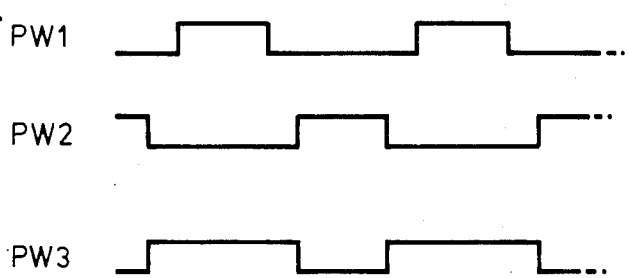
FIG. 4 shows the pulse waveforms PW1 to PW3 which operate to control the comparator CO of FIG. 3.

Only the PDM signals in the burst periods will be used as metering signals. Therefore the PDM signals in the interpulse time intervals and which could be interpreted in the telephone subset as metering pulses should be eliminated. For this reason the above output signals BS$+$ and BS$-$ are also applied to the inputs of a comparator CO which has outputs CR and $\overline{\text{CR}}$ and is shown in detail in FIG. 3. This comparator CO includes two identical inverters INV1 and INV2 comprising PMOS and NMOS transistors PM5, NM5 and PM6, NM6 respectively. The gate electrodes of the pair of transistors PM5 and NM5, as well as those of the pair of transistors PM6 and NM6 are commoned and constitute the inverter inputs I1 and I2 respectively, and the drain electrodes of the transistors of each of these pairs are also commoned and constitute the inverter outputs O1 and O2 respectively. The inverter output O1 is connected to the inverter input I2 and the inverter output O2 is likewise connected to the inverter input I1. The supply voltage V$+$ is connected to the interconnected source electrodes of PM5 and PM6 through the source-to-drain path of PMOS transistor PM7 which is controlled by pulse waveform PW3 (FIG. 4), and the commoned source electrodes of NM5 and NM6 are connected to V$-$ through the drain-to-source path of NMOS transistor NM7 which is controlled by PW2 (FIG. 2). The input BS+ of the comparator circuit CO is connected to the input I1 of INV1 through the drain-to-source path of NMOS transistor NM8, while the input BS— is likewise connected to I2 via NM9. Transistors NM8 and NM9 are both controlled by pulse waveform PW1 (FIG. 4). The above inverter inputs I1 and I2 constitute the outputs CR and $\overline{CR}$ of the comparator CO respectively.

This comparator circuit CO operates as follows when the pulse waveforms BS+ and BS— are applied to the like named inputs thereof.

When PW1 is activated or goes to the high state being a binary 1 the waveform BS+ and BS— are applied to the inverter inputs I1 and I2 via NM8 and NM9 respectively and are thus sampled since they are stored in the parasitic input capacitances which are present at these inputs. Afterwards, when PW2 is at binary 1 and PW3 on 0, both the inverters are made operative as both PM7 and NM7 then become conductive as a consequence of which V+ and V— are applied to the source electrodes of PM5, PM6 and of NM5, NM6 respectively so that both the inverters become operative. Hence, when BS+ is larger than BS—, NM5 and PM6 become fully conductive due to the amplifying action of the interconnected inverters. As a consequence the outputs CR and $\overline{CR}$ are then substantially at the voltages V+ and V— respectively i.e. they are activated (1) and deactivated (0) respectively. On the contrary, when BS— is larger than BS+, then $\overline{CR}$ and CR are activated and deactivated respectively.

From the above it follows that when the sign of (BS+)-(BS—) changes, the comparator output varies from 1 to 0 or vice-versa whilst output $\overline{CR}$ simultaneously changes from 0 to 1 and vice-versa. Thus the pulse periods and interpulse time intervals of pulse waveform BSO are characterized by CR=1, $\overline{CR}$=0 and CR=0, $\overline{CR}$=1 respectively.

Returning to FIG. 1, the outputs CR and $\overline{CR}$ of CO are connected to the control inputs of switches S3 and S4 which are similar to the switches S1 and S2 and comprise PMOS and NMOS transistors PM3, NM3 and PM4, NM4 respectively. The data input of S3 is connected to the above mentioned output BSO of the modulator circuit MOD and its data output is connected to output terminal MNTC and to the data input of S4 whose data output is grounded. The first control input of PM3 and the second one of S4 are connected to output $\overline{CR}$ of CO, while the second control input of PM3 and the first one of S4 are connected to output CR of CO.

As described above, CR=1 and $\overline{CR}$=0 during the pulse periods of BSO so that switches S3 and S4 are then closed and opened respectively and the output signal BSO appears at output terminal MNTC. On the contrary, in the interpulse time intervals of BSO, $\overline{CR}$=1 and CR=0 causing switches S3 and S4 to open and close respectively. Thus the output BSO is then disconnected from terminal MNTC and the latter is grounded.

From the above it follows that starting from a pulse waveform PW which varies between —VREF2 and +VREF1 pulse waveforms BS+ and BS— have been generated which vary between —VREF2 and +VREF1 and between +VREF2 and —VREF1 respectively, so that it is then easy to detect the crossings of both these waveforms and use this information to limit the amplitude of the PDM waveform BSO e.g. to zero between in the interpulse time intervals thereof.

The reason for proceeding in this way is as follows. When one employs a pulse waveform PW varying between VREF2=0 Volts and VREF1 then due to a possible offset of OA1 and/or of OA2 the lower level of BS+ in the interpulse time intervals is not at 0 Volt but lower, say at —ΔV1. Due to a possible offset of OA3 and the inversion the upper level of BS— in the interpulse time intervals will be at a higher value than 0 Volt, say +ΔV2. When the difference between +ΔV2 and —ΔV1 is sufficiently large the PDM signal in the interpulse time intervals is interpreted in the telephone subset as a metering signal. By forcing the level of BS+ and BS— in the interpulse time intervals to values which are equal to —VREF2 and +VREF2 independently from the operational amplifiers OA1-OA3 offsets, considerable amplitudes of BS+ and BS— are realised so that even when these amplifiers have an offset (always smaller than VREF2=0.7 Volts) it will always be possible to detect these amplitudes in the way described above and then limit the voltage amplitude of BSO to zero in the interpulse time intervals.

Because the leading and trailing edges of the bursts of the PDM signal in the above metering signal BSO generated at the output MNTC vary slowly, the amount of power contained in the audible frequency region of the metering signal is relatively small. Since this power is responsible for audible clicks in the telephone subset the danger of the occurrence of such clicks is thus reduced. However, this measure is still insufficient as this amount of power is still too high. To further reduce it, use is made of a filter device which is branched between terminal MNTC and the output terminal MNTB of the generator and includes the cascade connection of lowpass filter LPF1, bandpass filter BPF and lowpass filter LPF2. Filter LPF1 is a simple RC filter and is used as an anti-aliasing filter. Bandpass filter BPF is a sixth order switched-capacitor filter and comprises the cascade connection of a second order lowpass filter and of a fourth order bandpass filter (both not shown). This lowpass filter has a cut off frequency at 20 kHz and operates at a sampling frequency of 4096 kHz. It transforms the PDM waveform BSO into a waveform with bursts of a 12 kHz or 16 kHz sine wave and acts as an anti-aliasing filter for the bandpass filter which has a flat characteristic in a region covering 12 kHz to 16 kHz and operates at a sampling frequency of 256 kHz. The function of this filter is to pass the 12 kHz or 16 kHz sine wave and provide a further attenuation of the amount of power in the audible frequency region of the above signal BSO. Lowpass filter LPF2 is a so-called Rauch filter with a cut-off frequency of 50 kHz. This filter is well known in the art and is used to suppress in the output signal at MNTB residual signals produced by the switched-capacitor filter clock of the bandpass filter BPF.

While the principles of the invention have been described above in connection with specific apparatus, it is to be clearly understood that this description is made only by way of example and not as a limitation on the scope of the invention.

We claim:

1. A signal generator for generating a pulse wavetrain signal with each pulse having slopes at both the leading and trailing edges where the signal generated has a predetermined amplitude between pulses, comprising:
   means for generating first and second pulse signals with said signals varying between first and second reference levels and with said second signal being inverted with respect to said first, with each signal having corresponding sloping leading and trailing edges, means for comparing said first and second pulse signals to derive a first control signal indicative of the presence of a pulse and a second control signal indicative of the period between pulses, switching means connected to receive a signal containing said first and second pulse signals and controlled by said first and second control signals to provide at an output a pulse during said first control signal and a predetermined reference level during said second control signal, whereby said predetermined reference level between pulses is always known.

2. The signal generator according to claim , further including:

a pulse source for generating first and second pulse waveforms having respectively opposite polarities, each pulse waveform being symmetrically disposed about a given reference level and means coupling said first and second pulse waveforms to said switching means.

3. The signal generator according to claim 1, wherein said means for generating said first and second pulse signals includes:

first amplifier means having an input adapted to receive a pulse signal having relatively steep leading and falling edges, and having the output of said amplifier means coupled to a constant current source for providing an output pulse signal between said first and second reference levels, with a comparator coupled to said output to provide a sloped rise and fall time as controlled by said current source and second amplifier means coupled to said output of said first amplifier means and operative to provide an inverted signal whereby said output from said first amplifier means is said first pulse signal with said output from said second amplifier means being said second pulse signal.

4. The signal generator according to claim 2, wherein said means coupling said first and second waveforms includes first and second switches each having a control input, a data input and a data output, the first pulse waveform being applied to said control input of said first switch, and the second pulse waveform being applied to said control input of said second switch, with said data input of said first switch receiving said first pulse signal and said data input of said second switch receiving said second pulse signal, with said data outputs of said switches coupled together to cause either said first or second pulse signal to appear at said coupled outputs according to said first and second waveforms as applied to said control inputs, with said coupled outputs of said switches coupled to said switching means.

5. The signal generator according to claim 3, wherein said first amplifier means includes a first operational amplifier having the non-inverting input terminal adapted to receive said pulse signal, and having an output terminal and an inverting input terminal.

6. The signal generator according to claim 5, wherein said current source includes a first current source connected to said first reference level in series with a second current source connected to said second reference level, with the junction between said sources connected to the output of said first operational amplifier, with said junction further connected to said inverting terminal of said first operational amplifier, and with said capacitor having one terminal connected to said junction with the other terminal connected to a point of reference potential.

7. The signal generator according to claim 6, further including:

a second operational amplifier having a non-inverting terminal connected to said junction with an inverting terminal connected to the output terminal of said second operational amplifier, whereby said second operational amplifier has a unity gain.

8. The signal generator according to claim 7, wherein said second amplifier means includes a third operational amplifier having an inverting input coupled to the output of said second operational amplifier, with a non-inverting input coupled to a point of reference potential and with the output coupled to said inverting terminal via a resistor to provide at said output said second pulse signal.

9. The signal generator according to claim 4, wherein said first and second pulse waveforms are pulse density modulated pulse waveforms.

10. The signal generator according to claim 9, further including filtering means coupled to the output of said switching means for filtering said pulse signal.

11. The signal generator according to claim 10, wherein said filtering means includes a lowpass filter in series with a bandpass filter.

12. The signal generator according to claim 1, wherein said pulse wavetrain signal is employed as a metering signal for a telecommunication system.

13. A signal generator for generating a pulse signal with pulses having slopes at both the leading and trailing edges where the amplitude of the signal generated in the time intervals between said pulses is of a predetermined value, comprising:

means for generating a first pulse signal which varies between a first and a second reference level with said signal having sloping leading and trailing edges, and for providing a second pulse signal which is an inversion of said first pulse signal which varies between inverted values of said second and first reference levels, comparator means responsive to said first and second pulse signals to provide at an output first and second control signals depending upon which of said first and second pulse signals are greater, modulating means connected to receive a pulse waveform and responsive to said first and second pulse signals for providing at an output a modulated signal representative of said first and second pulse signals symmetrically disposed about a reference potential and modulated by the pulse waveform, switching means having first and second control inputs for receiving said first and second control signals and an output, and having said modulated signal applied thereto to provide at said switching means output during a first switched mode said modulated signal and during a second switching mode a reference potential.

* * * * *